United States Patent [19]

Bedard et al.

[11] 4,435,679

[45] Mar. 6, 1984

[54] PROGRAMMABLE SIGNAL AMPLITUDE CONTROL CIRCUITS

[75] Inventors: James F. Bedard; Charles W. Eichelberger, both of Schenectady; Salvatore F. Nati, Jr., Syracuse, all of N.Y.

[73] Assignee: General Electric Company, Schenectady, N.Y.

[21] Appl. No.: 479,048

[22] Filed: May 12, 1983

Related U.S. Application Data

[62] Division of Ser. No. 267,274, May 26, 1981, Pat. No. 4,414,501.

[51] Int. Cl.³ .............................................. G05B 24/02
[52] U.S. Cl. .................................... 323/350; 323/268; 330/263
[58] Field of Search ........ 323/349, 350, 351, 268-272; 330/254, 256, 260, 263

[56] References Cited

U.S. PATENT DOCUMENTS

| | | | |
|---|---|---|---|
| 3,651,333 | 3/1972 | Goldberg et al. | 323/268 X |
| 3,697,862 | 10/1972 | Taylor | 323/268 |
| 3,835,390 | 9/1974 | de Sae Silva | 330/263 X |
| 4,196,381 | 4/1980 | Standing | 323/350 |
| 4,218,638 | 8/1980 | Breithaupt | 330/263 X |

*Primary Examiner*—Peter S. Wong
*Attorney, Agent, or Firm*—Nathan D. Herkamp; Philip L. Schlamp

[57] ABSTRACT

A circuit, for providing a periodic signal of programmably controllable amplitude, includes an oscillator having a substantially constant amplitude signal of desired frequency and waveform at an output thereof connected to the input of a first programmable voltage divider having its output connected to one input of an operational amplifier. The remaining operational amplifier input is connected to the output thereof via a second programmable voltage divider used as a programmably controllable feedback network. The operational amplifier output signal amplitude may be controlled by external data signals to values less than, equal to, and greater than, the substantially constant oscillator waveform amplitude. Both computer and hard-wired circuitry for controlling the output signal are disclosed. An isolation-and-rectification network may be used to recover a D.C. voltage of programmably controlled amplitude.

19 Claims, 8 Drawing Figures

PROGRAMMABLE SIGNAL AMPLITUDE CONTROL CIRCUITS

This is a divisional of applicaion Ser. No. 267,274, filed May 26, 1981, now U.S. Pat. No. 4,414,501.

BACKGROUND OF THE INVENTION

The present invention relates to waveform amplitude control circuits and, more particularly, to novel programmable signal amplitude control circuits and to methods of operating the circuits to provide a desired output therefrom.

In many forms of remotely-controlled systems, it is desirable to transmit information by means of a varying amplitude of a D.C. level or an A.C. waveform. Frequently, the circuit controlling the amplitude of the signal requires many costly components, detracting from the advantageous use thereof in high-volume systems. In particular, with the present emphasis upon energy conservation it is desirable to provide a remotely-programmable lighting system, and especially such a system wherein maximum light level in an area can be set, such that individual users can not control the variable light output in their area to a greater value than the pre-established maximum. In such a system, it is also desirable that other values of light ouput, below the pre-established maximum, can be easily, and preferably linearly, set by the individual user. Further, it is highly advantageous that area lighting system output be under programmable control, such as from a microcomputer and the like at a central facility. Additionally, in such systems, the lighting loads are often connected to a powerline, requiring the control electronics be capable of being isolated from the relatively high-voltage powerlines for reasons of personal safety.

It is also highly desirable to be able to operate the signal amplitude control circuit in such a manner that immediate changes in lighting level can be effected, such as when the lighting is initially turned-on or is turned-off to a zero output value, yet still allow operation of the load with a gradual change in output between a pair of discrete levels. Accordingly, a programmable signal amplitude control circuit for achieving abrupt and/or gradual changes in output level thereof, is highly desirable.

BRIEF SUMMARY OF THE INVENTION

In accordance with the invention, a programmable signal amplitude control circuit utilizes an oscillator providing an A.C. waveform of substantially constant amplitude at a desired frequency. The oscillator output waveform is applied to the input of a first programmable voltage divider, whereby the oscillator waveform is initially attentuated by an externally-controllable amount. The output of the first voltage divider is applied to one input of an operational amplifier having a feedback path therearound, in which is used a second voltage divider having a programmable attenuation, whereby the gain of the operational amplifier is settable in programmable fashion responsive to other externally-provided control signals. The operational amplifier output signal is thus externally-programmable (e.g. as by means of a microcomputer and the like) between amplitudes over a broad range less than, equal to, and greater than the amplitude of the oscillator output.

In one preferred embodiment of the present invention, at least one of the variable voltage dividers is manually programmable, whereby a fixed maximum and/or minimum control circuit output signal is settable, and may not be exceeded under program control. A transformer is utilized to provide isolation, and a rectifier-filter circuit is utilized to provide an output signal coupled to a subsequent load, which is a D.C. voltage of amplitude responsive to the externally-provided control signals.

The externally-provided control signals may be utilized to abruptly change the output level, by effecting a single rapid change in the division value of one or both of the voltage dividers, or, as more fully described in copending application Ser. No. 267,330, filed on even date herewith and incorporated herein by reference in its entirety, may effect a gradual change between two selected ones of a preselected plurality of distinct levels, by operation such than an increasing number of oscillator waveform cycles in a time interval (having a fixed number of cycles therein) are transmitted with the final value and the remainder of the waveform cycles of each time interval are transmitted with the initial value, to gradually increase the D.C. voltage amplitude to the subsequent load.

In the presently preferred embodiment of the present invention, a single variable voltage divider is programmably controlled, by a set of outputs of a microcomputer, to provide a variable amplitude waveform capable of either abrupt or gradual changes, and with an additional microcomputer output being utilized to change the oscillator waveshape to provide a pulse waveform output when the load is to be controlled to a zero output level (off) condition.

Accordingly, it is one object of the present invention to provide novel programmable signal amplitude control circuits.

This and other objects of the present invention will become apparent upon consideration of the following detailed description, when read in conjunction with the drawings.

DETAILED DESCRIPTION OF THE INVENTION

Figure 1:
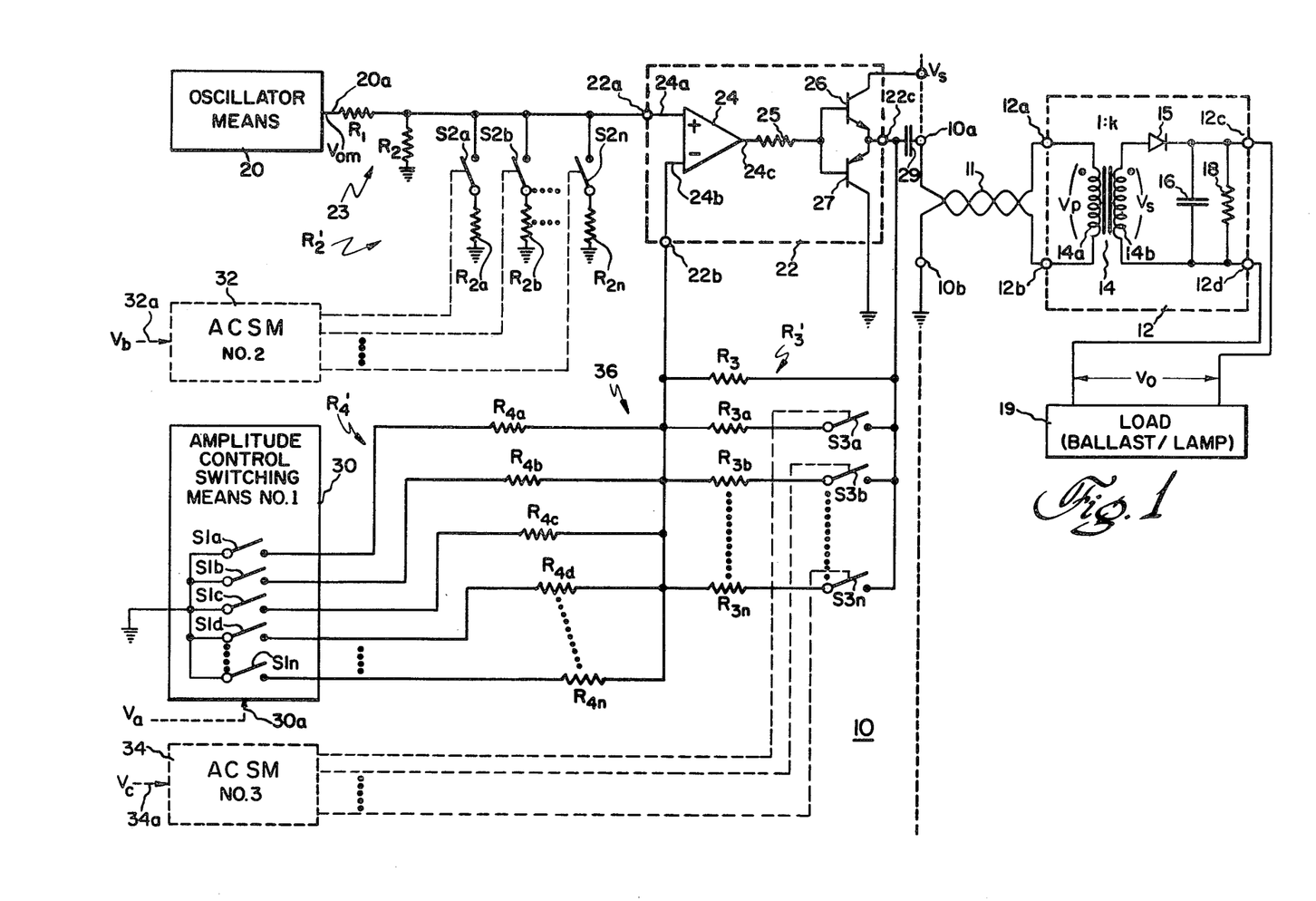
FIG. 1 is a schematic block diagram of a programmable signal amplitude control circuit in accordance with the principles of the present invention, and of a portion of a system in which such control circuit may be utilized.

Referring initially to FIG. 1, a programmable signal characteristic control circuit 10 provides a periodic waveform of adjustable characteristic magnitude, e.g. amplitude, at an output terminal 10a thereof, with respect to a common terminal 10b thereof, illustratively at ground potential. The controlled-amplitude periodic-waveform signal may be transmitted via transmission medium 11, such as a twisted wire pair, coaxial cable and the like, to the inputs 12a and 12b of a load circuit 12. Illustratively, load circuit 12 is an isolation-and-conversion circuit having an isolation transformer 14 with a primary winding 14a across which winding the output signal of control circuit 10 appears with the magnitude $V_p$. A secondary winding 14b of the transformer provides the control circuit periodic waveform at a secondary voltage magnitude $V_s$ (which may be greater than, equal to or less than the primary voltage magnitude, in accordance with the primary winding to secondary winding turns ratio 1:k). The secondary winding periodic voltage is converted to a D.C. analog voltage of magnitude $V_O$, between the subsequent circuit output terminals 12c and 12d, by action of a rectifier diode 15, energy-storage capacitor 16 and load resistance 18. Means 12 may be part of the control circuit or may be a separate circuit, coupled to a subsequent load 19 such as the single D.C. voltage input of a ballast/lamp controller, as more fully described and claimed in co-pending application Ser. No. 242,782, filed on Mar. 11, 1981, now U.S. Pat. No. 4,345,200, assigned to the assignee of the present invention and incorporated herein by reference. As described in that application the D.C. analog voltage signal $V_O$ is utilized to set the lighting output level of a variable-output flourescent lamp/ballast combination in a programmable lighting system.

Programmable signal amplitude control circuit 10 includes an oscillator means 20 for providing a periodic signal at a desired frequency and an essentially constant amplitude Vom at the output 20a thereof. The periodic signal is applied to the non-inverting input 22a of a power operational amplifier 22, via a first voltage divider 23, including a series resistance $R_1$ and a shunt resistance $R_2$, connected between the operational amplifier non-inverting input and ground potential.

Operational amplifier 22 illustratively is realized by the use of a differential amplifier 24, having its non-inverting input 24a connected to the operational amplifier non-inverting input terminal 22a and its inverting input 24b connected to operation amplifier inverting input terminal 22b. The amplifier output 24c is connected through a resistance 25 to the base electrodes of a complementary-symmetry pair of output transistors 26 and 27. The collector electrode of the NPN transistor 26 is connected to a source of operating potential magnitude $+V_S$, while the emitter electrode thereof is connected to operational amplifier output terminal 22c and the emitter electrode of the PNP transistor 27, having its collector electrode connected to ground potential. As is well-known, this configuration provides an operational amplifier having an increased output current capability.

The operational amplifier output 22c is connected via a D.C. isolation capacitance 29 to circuit output terminal 10a and is also connected back to operational amplifier inverting input terminal 22b via a feedback resistance $R_3$. It will be seen that, with only the voltage divider formed of resistances $R_1$ and $R_2$ connected to the non-inverting input, and with feedback resistance $R_3$ connected between inverting input and output, the operational amplifier circuit is a voltage follower having a gain of less than one (i.e. a gain given by $R_2/(R_1+R_2)$, and therefore provides an output signal at the same frequency as, but with a lesser amplitude than the signal at oscillator output 20a.

A plurality of feedback resistance elements $R_{4a}$–$R_{4n}$ each have one terminal thereof connected to operational amplifier inverting input 22b and the remaining terminal thereof connected to one terminal of a like plurality of associated and individually controllable switch means $S1a$–$S1n$ of a first amplitude control switching means 30. The remaining terminals of switches $S1a$–$S1n$ are connected together to a fixed potential, such as ground potential. A control input 30a receives a digital control signal $V_a$, controlling which of switch means $S1a$–$S1n$ are to be short-circuited or open-circuited, at any particular time. An equivalent resistance $R_4'$ is thus connected between ground potential and operational amplifier input 22b; equivalent resistance $R_4'$ has a resistance magnitude dependent upon the configuration of those switch means $S1a$–$S1n$ connecting associated ones of resistance elements $R_{4a}$–$R_{4n}$ to ground potential. The control circuit output signal amplitude $V_p$ is thus given by the formula $V_p = V_{om}(1+(R_3/R_4')) \times (R_2/R_1+R_2)$. Thus, if the ratio of resistance $R_1$ to resistance $R_2$ is less than the ratio of $R_3$ to resistance $R_4'$, the amplitude of the periodic waveform at circuit output terminal 10a will be greater than the oscillator means output waveform amplitude. Similarly, if equivalent resistance $R_4'$ is much greater than resistance $R_3$, as by open-circuiting all of associated switches $S1a$–$S1n$, the operational amplifier voltage-follower has a gain of one and only the input attenuator 23 (of resistances $R_1$ and $R_2$) acts on the signal amplitude; the circuit output signal is of lesser amplitude then the oscillator means output signal amplitude.

A second plurality of resistance elements $R_{2a}$–$R_{2n}$ each have one terminal connected to a fixed potential, such as ground potential, and the remaining terminal connected to one terminal of an associated one of a like plurality of individually controllable switch means $S2a$–$S2n$. The remaining terminal of each of switches $S2a$–$S2n$ are all connected in parallel to operational amplifier non-inverting input 22a, whereby each of resistance element $R_{2a}$–$R_{2n}$ will be in parallel electrical connection with resistance $R_2$ when the associated switch means $S2a$–$S2n$ is short-circuited. Switch means $S2a$–$S2b$ are part of a second amplitude control switching means 32, and are set to their respective open and closed positions in accordance with the data of a digital control signal $V_b$ at a data input 32a thereof. Another plurality of resistance elements $R_{3a}$–$R_{3n}$ each have one terminal thereof connected to one terminal of an associated one of a like plurality of individual controllable additional switch means $S3a$–$S3n$. Each of the series-connected resistance-switch circuits are connected in parallel across resistance $R_3$. Each of the switch means $S3a$–$S3n$ forms a part of a third amplitude control switching means 34 and is individually controlled in accordance with the data contained in a third digital information signal $V_c$, at a control input 34a, thereof.

Each of digital control signals $V_a$, $V_b$ and $V_c$ may be supplied manually, or by programmable apparatus, such as a microcomputer and the like. Thus, it will be seen that an effective resistance magnitude $R_2'$ (the equivalent resistance between operational amplifier non-inverting input terminal 22a and ground potential) can be varied, as can the resistance magnitude of another feedback resistance $R_3'$ (the equivalent resistance between operational amplifier inverting and output terminals 22b and 22c, respectively), in additional to programmably variable resistance $R_4'$ (between operational amplifier inverting input terminal 22b and ground potential). Resistances $R_3'$ and $R_4'$ from a second programmably controllable resistive voltage divider 36 having an input connected to output terminal 22c and an output connected to inverting input terminal 22b.

The control circuit output voltage $V_p$ is now given by $V_p = V_{om}(1 + (R_3'/R_4')) \times (R_2'/(R_1 + R_2'))$. Variation of the magnitude of resistance $R_2'$ may be utilized, if $R_3'$ and $R_4'$ are of the same order of magnitude, to establish the magnitude of the output signal at a value less than the magnitude of the oscillator output signal, while coordinated variation of the values of resistances $R_3'$ and $R_4'$ may be utilized to establish the value of the output signal at a magnitude greater than, or equal to, the magnitude of the oscillator output signal. Therefore, a wide range of output signal amplitudes can be programmably controlled by the data signals $V_a$, $V_b$ and $V_c$. Further, one of a range of minimum output amplitudes can be selected by closure of an associated one of switch means $52a-52n$, with the size of the output steps then being controlled by either, or both of $S_a-S_{3n}$ and $S_{1a}-S_{1n}$.

Figure 1A:
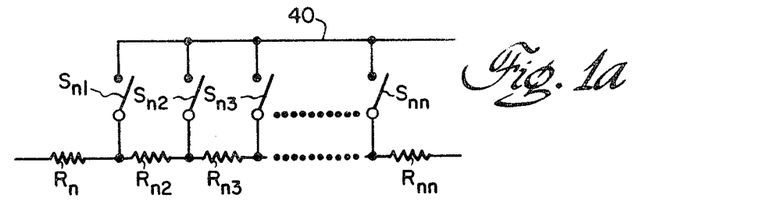
FIGS. 1a and 1b are schematic diagrams of control network configurations which may also be utilized in the circuit of FIG. 1.
Figure 1B:
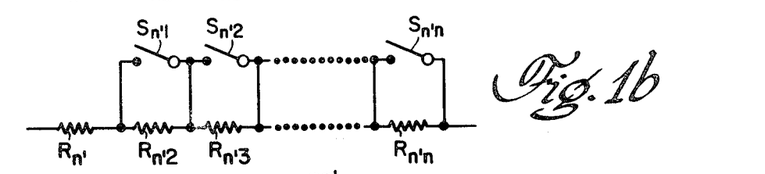

Referring now to FIGS. 1a and 1b, each of the programmably-controllable and step-wise variable resistances (the paralleled sets represented in FIG. 1 by equivalent resistances $R_2'$, $R_3'$ and $R_4'$) may be equally as well provided by an equivalent resistance $R_n$, comprised of a series string of a plurality of resistances $R_{nl}-R_{nn}$, having the junctions therebetween connected to a common line 40 by closure of an associated one of a plurality of switch means $S_{n1}-S_{nn}$. Similarly, each of the equivalent resistances may be provided by an equivalent resistance $R_n'$ comprised of a string of series resistances $R_{n'l}-R_{n'n}$ having a pair of adjacent junctions therebetween selectively short-circuited by means of an associated one of plurality of switch means $S_{n'1}-S_{n'n}$. It should be understood that many other resistance switching arrangements may be useful, in controlling the magnitude of each of resistances $R_1$, $R_2'$, $R_3'$ and $R_4'$, to programmably adjust the values thereof to provide the oscillator output waveform with a desired control amplitude at the output 10a of amplitude control circuit 10. It should also be understood that each switch means may be electromechanical, mechanical or electronic in nature, e.g. the output of a switching transistor or logic gate and the like.

Figure 1C:
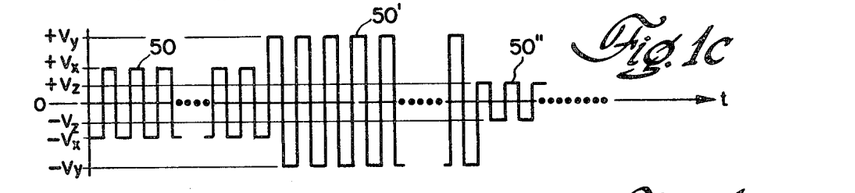
FIGS. 1c and 1d are coordinated graphical illustrations of waveforms occurring in the circuitry of FIG. 1 in one presently preferred mode of operation, and useful in understanding operation of the present invention.
Figure 1D:
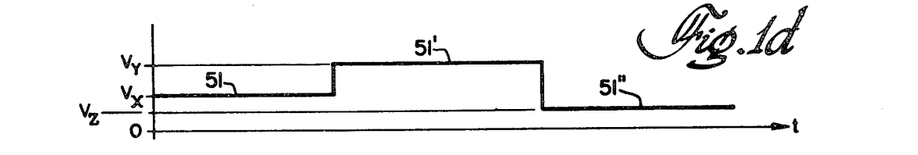

Referring now to FIGS. 1c and 1d, in one presently preferred mode of operation, oscillator means 20 may produce a square waveform, which square waveform is made to appear at circuit output 10a as a waveform 50 having a first peak-to-peak amplitude, e.g. alternating between a positive-polarity amplitude of $+V_x$ and a negative-polarity amplitude of $-V_x$. Assuming negligible attenuation of the waveform during transmission through media 11, the control circuit waveform appears across transformer winding 14a as the primary voltage $V_p$ thereof, as shown in FIG. 1c. Rectification of the secondary winding periodic waveform provides a first output voltage waveform 51 which is a D.C. analog level of associated magnitude $+V_X$ (which may control the subsequent load, e.g. a dimmable fluorescent lamp, to a first output level). By modification of the digital signals $V_a$, $V_b$ and/or $V_c$, the closure of the appropriate ones of switch means $S_{1a}-S_{1n}$, $S_{2a}-S_{2n}$ and $S_{3a}-S_{3n}$ may be effected to change, e.g. increase, the magnitude of the control circuit output waveform, to provide a primary winding voltage $V_p$ waveform 50' alternating between a positive-polarity magnitude $+V_y$ and a negative-polarity magnitude $-V_y$, where $|V_y|$ is different from, e.g. greater than, $|V_x|$. Responsive to the increased absolute amplitude of the control circuit output waveform, the rectified waveform 51' is a D.C. analog voltage of level $V_Y$, with $V_Y$ being different from, e.g. greater than, $V_X$ (which may control the subsequent load to another output level different from the output level to which the subsequent load was controlled by the D.C. analog voltage output magnitude $V_x$).

Subsequently, new digital command signals may be given to again vary the programmed output voltage of control circuit 10 to reduce, rather than increase, the magnitude of output waveform 50'' to peak values of $+V_z$ and $-V_z$. Accordingly, the rectified voltage $V_O$ D.C. analog voltage level 51'' decreases to a value $+V_Z$, which may control the subsequent load to an output level different from the output levels set by either output level magnitudes $V_X$ or $V_Y$.

It will be seen that a multiplicity of control circuit output waveform magnitudes (and a similar multiplicity of associated D.C. analog voltage $V_O$ levels) may be provided by proper choice of both the number and value of resistances $R_{2a}-R_{2n}$, $R_{3a}-R_{3n}$ and $R_{4a}-R_{4n}$, for any given value of resistance $R_1$. Particular utility may be found in the use of binary scaling of the resistances forming any of the sets of the plurality of resistors making up equivalent resistances $R_2'$, $R_3'$ and/or $R_4'$. It should also be understood that the values of fixed resistors $R_1$, $R_2$ and $R_3$ may be selected to achieve a predetermined minimum or maximum control circuit output waveform signal level, which may be less than, equal to, or greater than the substantially constant magnitude of the oscillator waveform, as desired for a particular end use. This is especially important where the amplitude control switching means 30, 32 and/or 34 are directly interfaced to programming apparatus, such as a microcomputer and the like; if the programming apparatus fails, for any reason whatsoever, to issue amplitude control signals $V_a$, $V_b$ and $V_c$ to control circuit 10, the predetermined minimum or maximum output waveform amplitude will be achieved (which may be utilized, for example, to establish a minimum or maximum load output level in the event of programming apparatus failure). Further, it should be understood that some of the amplitude control switching means 30, 32 and 34 may be deleted and the associated switch means may be replaced with manually activatable switches, whereby minimum and/or maximum circuit output waveform magnitudes may be field selectable, with the remaining amplitude control switching means being utilized in programmable fashion to select output signal magnitudes in the range set by the manually-selected minimum and/or maximum magnitudes.

It will be seen, however, that the transition between levels, such as the transition from output level 51 to a greater level 51', or from level 51' to a lesser level 51'', is a substantially rapid transition. Particularly, where the light output level of an electronically-controlled ballast/lamp combination is provided responsive to the output magnitude of the control circuit waveform, as set by the data output of the microcomputer, it is advantageous that a relatively small number, e.g. 8, of discrete levels of control amplitude waveform be used. However, it is often annoying, to persons in an area controlled by such a programmable lighting system, to have the lighting level rapidly shift from one level to the next, as the computer carries out a lighting level adjustment. Accordingly, it is desirable to operate control circuit 10 in such a manner as to make the change between different levels occur at a sufficiently slow rate that the load output level change is not readily noticeable. While such a slow transition may be effected by increasing the value of energy-storage capacitor 16, the use of a large capacitor is not only undesirable from a cost standpoint, but also substantially reduces the ability to effect a desired rapid change in output level, as when the load is to be turned immediately on to full output level or immediately off to zero output level.

Figure 2A:
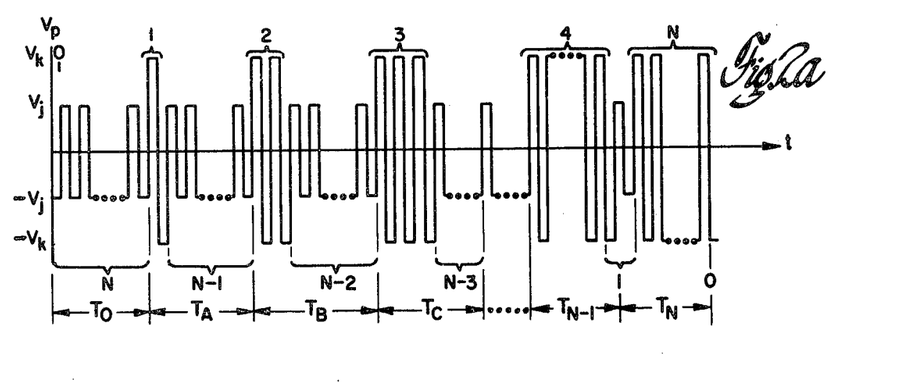
FIGS. 2a and 2b are coordinated graphical illustrations of waveforms occurring in the circuit of FIG. 1 in another presently preferred mode of operation.
Figure 2B:
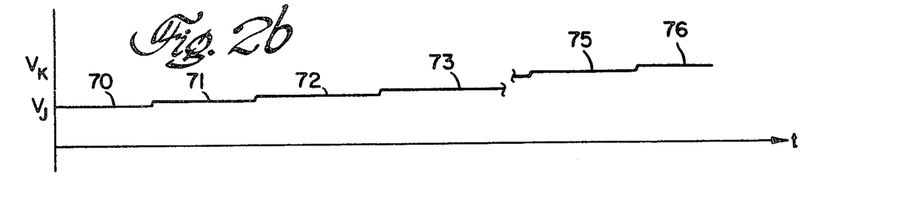

One solution to this problem may be found in the method of operation described and claimed in the aforementioned application, Ser. No. 267,330. In that application, and as shown in FIGS. 2a and 2b, programmable signal amplitude control circuit 10 may be operated to change the output signal magnitude in programmable manner while at the same time eliminating sudden transitions in the magnitude of the D.C. analog level recovered therefrom. The amplitude of the control circuit waveform is varied, between the level presently utilized (the initial level) and the next-commanded (final) level, at a rate that is greater than the time constant, set by the value of filter capacitance 16 and load resistance 18, of the circuit (e.g., isolation-and-conversion circuit 12) which is a load thereon. If the oscillator waveform frequency is substantially greater than the inverse of that time constant, a gradual change in the time duration during which each of the final and initial levels are present in a fixed time interval T, will gradually change the load circuit output voltage $V_O$ in a smooth manner.

More particularly, assume that the oscillator frequency is about two orders of magnitude greater than the inverse of the load time constant; the number of waveform cycles at each level is controlled on a cycle-by-cycle basis and is gradually changed, from an initial interval $T_A$ of N cycles at the initial level, through N−1 intervals of N−M (where M changes sequentially from 1 to N−1) initial cycles at the final level and then M cycles at the initial level, to a final time interval with all N cycles at the final level. Thereafter, the amplitude is no longer controlled on a cycle-by-cycle basis, but the control circuit output waveform remains at the final level. Thus, for example, prior to the start of a zero-th time interval $T_o$, the microcomputer (not shown) has been commanded to gradually change the output analog voltage from a first level $V_j$ to a second level $V_k$. The digital control signals $V_a$, $V_b$ and $V_c$ had previously been set to those values necessary to provide an initial $V_J$ level D.C. analog output level, whereby the control circuit output-transformer primary winding voltage $V_p$ waveform alternates between levels of $+V_j$ and $-V_j$. During this time interval, which may contain N oscillator waveform cycles, the digital commands given to the various amplitudes control switching means 30, 32 and/or 34 continue to set the output waveform amplitude at initial level $\pm V_j$. During the next-subsequent (first) time interval $T_A$, the amplitude control switching means digital input signals $V_a$, $V_b$ and $V_c$ are modified by the microcomputer to cause the first oscillator waveform cycle in that time interval to be transmitted with peak amplitudes of $+V_k$ and $-V_k$, for providing the final output level $V_K$. The remaining N−1, e.g. 499, cycles (for an illustrated system having N=500 oscillator waveform cycles in each time interval) during the first time interval $T_A$ are each transmitted at the previous (initial) level, by causing digital control signals $V_a$, $V_b$ and $V_c$ to revert to the appropriate values for the initial signal amplitude. In the next (second) time interval $T_B$, the first two oscillator waveform cycles are transmitted with the amplitude assigned to the final output value and the remaining (N−2) of the N cycles in this interval are transmitted at the initial amplitude. Similarly, during an immediately-following time interval $T_C$, the first three cycles are transmitted with the final-value amplitude and the remainder (N−3) of the N cycles are transmitted with the initial amplitude. The number of initial waveform cycles, transmitted with the final-value amplitude, in each interval is increased by 1 and the number of cycles in the remainder of each time interval, transmitted with the initial-value amplitude, is decreased by 1, in each subsequent time interval. Thus, in the next-to-last time interval $T_{N-1}$, the first N−1 cycles are transmitted with the final-value amplitude and the last cycle is transmitted with the initial amplitude; in the final time interval $T_N$ all N cycles are transmitted with the final-value amplitude. Thereafter, all cycles are transmitted with the final-value amplitude, alternating between levels of $+V_k$ and $-V_k$. Thus, the change occurs over N time intervals, wherein the first M cycles are transmitted at the final-value and the subsequent (N−M) cycles are transmitted at the initial value, with M starting at a value of 1 and being increased by 1 for each subsequent time interval until M equals N.

The recovered D.C. analog voltage $V_O$ will, as shown in FIG. 2b, have its initial value $V_J$ during time interval $T_o$. During the next time interval $T_A$, the increased-amplitude first pulse will charge storage element 16 to a greater extent than the somewhat lesser magnitude waveform associated with the initial value; as the discharge time constant associated with storage element 16 is much greater than the time for one cycle control circuit waveform, the additional energy storage element 16 will be added to the energy stored therein during the subsequent N−1 cycles at the initial value, whereby the output level 71 during time interval $T_A$ will be slightly greater than the output level 70 during initial time interval $T_o$. Similarly, the reception of two cycles of the final-value amplitude, at the start of time interval $T_B$, will add even further charge to energy storage element 16 and raise the voltage thereacross slightly, whereby the associated output voltage 72 is slightly greater than the previous level 71. During third time interval $T_C$, the three initial cycles of final-value amplitude will cause the output voltage $V_O$ to again have a level 73 different from (e.g. greater than) the level previous level 72.

Eventually, in the next-to-last time interval $T_{N-1}$, the N−1 cycles of the final-value level waveform provide an output level 75 which is slightly different from (e.g. greater than) the immediately-previous level, and which level almost approaches the final level 76 of magnitude $V_K$, finally provided when all N cycles of the control circuit waveform have their final-value magnitudes in the final time interval $T_N$ of the amplitude-shift procedure. Thus, there is no sudden jump in output level between initial magnitude 70 and final magnitude 76, but only a gradual change in output magnitude therebetween. It should be understood that the final-valued-amplitude waveform cycles need not occur at the commencement of the associated time interval, and that M, the number of final-value-magnitude cycles in a time interval, need not increase only in unit steps in successive time intervals; M may, if desired, increase by more than a integer (factor K greater than one) with a concommittant decrease in the number N of time intervals by the selected factor K. Thus, each of $N'=N/K$ time intervals may commence with M' cycles (where M' is an integer successively increasively increasing in steps of K units from K to N) of final-value peak magnitude and be followed by (N−M') cycles of initial-value peak magnitude. For example, if N=300 and K=2, a total of N'=150 time intervals (of N=300 cycles each) are used, with the initial interval having K=2 cycles of final-value magnitude and (N−K)=298 cycles of final-value magnitude. The next interval starts with 2K=4 cycles of initial-value magnitude, followed by (N−2K)=296 cycles of final-value magnitude; a third interval starts with 3K=6 cycles of final-value magnitude, followed by 294 cycles of initial-value magnitude, etc. It should also be understood that turning the load from a first magnitude level to a selected second level (such as may be used for "immediate-on", "immediate-off" or "immediate-output-level-charge" operations) may be accomplished by setting the number N of intervals to zero, whereby the circuit output waveform magnitude changes from continuous cycles at the initial level to subsequent continuous cycles at the new level.

Figure 3:
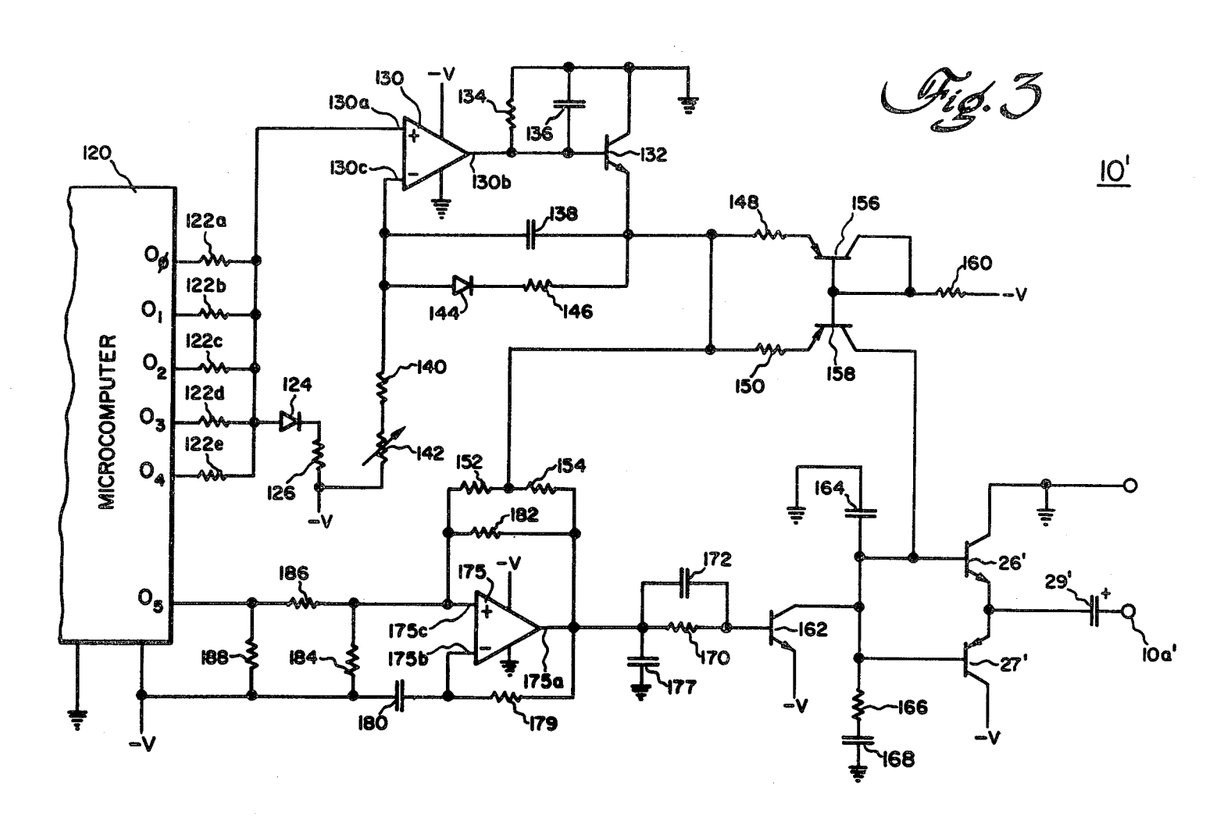
FIG. 3 is a schematic diagram of the presently preferred embodiment of our novel signal amplitude control circuit in accordance with the principles of the present invention.

Referring now to FIG. 3, the presently preferred circuit 10" operates under control of a microcomputer 120, having a plurality of output O lines. In the illustrative embodiment, in which microcomputer 120 is a Texas Instruments TMS 1100 and the like microcomputer, five individually-settable outputs $O_0$–$O_4$ are each connected to one terminal of five amplitude-setting resistance elements 122a and 122e. The remaining terminals of resistance elements 122a–122e are connected together and thence to the anode of a diode 124, having its cathode connected through a resistance element 126 to circuit operating potential. As the particular TMS 1100 microcomputer integrated circuit is of the type energized by a negative operating potential with respect to ground potential, the common negative operating potential −V is utilized in circuit 10". The paralleled terminals of resistance elements 122a–122e are also connected to the non-inverting input 130a of a first voltage comparator 130. A first comparator output 130b is connected to the base electrode of a NPN transistor 132. A resistance element 134 and a capacitance element 136 are connected between the transistor 132 base and collector electrodes, with the collector electrode being connected to ground potential. The emitter electrode of transistor 132 is connected through a capacitance element 138 to the comparator inverting input 130c. Input 130c is also connected to negative operating potential −V through the series combination of a resistance element 140 and a potentiometer 142. Inverting input 130c is connected to the anode of another diode 144, having the cathode thereof connected through a resistance element 146 to the emitter electrode of transistor 132. The emitter electrode of transistor 132 is connected to one terminal of each of 4 resistance elements 148, 150, 152 and 154. The remaining terminals of resistors 148 and 150 are each connected to the emitter electrode of a different one of a pair of PNP transistors 156 and 158. The base electrodes of both transistors 156 and 158, and the collector electrode of 156, are connected together in parallel, and through a resistance element 160, to negative operating potential −V. The collector electrode of transistor 158 is connected: to the base electrodes of both output transistors 26' and 27'; to the collector electrode of another transistor 162, and to ground potential via a capacitive element 164, in parallel with a series-connected resistance element 166 and capacitive element 168. The collector electrode of output transistor 26' is connected to ground potential, while the collector electrode of output transistor 27' is connected to negative operating potential −V. The emitter electrodes of both transistors 26' and 27' are connected through output capacitance 29' to the circuit output 10a'.

The emitter electrode of transistor 162 is connected to negative operating potential −V, while the base electrode thereof is connected through the parallel connection of a resistance element 170 and a capacitive element 172 to the output 175a of a second comparator 175. Advantageously, comparators 130 and 175 are provided by a multi-comparator integrated circuit, such as the National Semiconductor Corp. LM339 and the like type integrated circuits. It should be understood that any standard high gain, operational or comparator amplifier may be equally as well utilized for each of comparators 130 and 175. Comparator output 175a is connected to ground potential via the capacitive element 177 and is also connected to the remaining terminal of resistor element 154. A feedback resistance element 179 is connected from output 175a to a comparator inverting input 175b, from which input is connected a timing capacitance 180 to negative operating potential −V. Another feedback resistance 182 is connected between comparator output 175a and a comparator non-inverting input 175c, to which input is also connected the remaining terminal of resistance element 152, and one terminal of each of another pair of resistance elements 184 and 186. The remaining terminal of resistance element 184 is connected to negative operating potential, along with a first terminal of another resistance element 188. The remaining terminals of both resistance elements 186 and 188 are connected to another independently-programmable output $O_5$ of microcomputer 120.

Comparator 130 is a low-frequency feedback amplifier with resistance element 134 and capacitive element 136 providing a break point at a relatively low frequency. Amplifier transistor 132 is utilized to allow the voltage at the low frequency amplifier output (the emitter electrode of transistor 132) to be pulled-up to within one base-emitter diode-drop of the most positive voltage in the circuit, i.e. ground potential. Gain of this amplifier is set by the effective resistance between the negative operating potential and inverting input 130c, and is therefore established by the series combination of resistance element 140 and adjustable resistance 142. This amplifier will act, in conjunction with resistance elements 122a–122e and 126, as a digital-to-analog converter, whereby, with proper scaling of resistance elements 122a–122e, the voltage at the amplifier output (transistor 132 emitter) will change in equal steps as the digital representation at outputs $O_0$–$O_5$ sequentially changes. Thus, the O outputs represents open-drain PMOS devices which can be pulled-up to the positive, or ground, potential, to place an associated one of resistance elements 122 in circuit, to establish the output amplitude; when the output is disabled, the output devices float and disconnect the associated resistor from circuit gain-setting operation. Diode 124 provides an offset voltage to allow matching of the circuit output 10a' voltage amplitude to the characteristics of the subsequent load to be controlled. Feedback loop diode 144 is utilized to compensate for any temperature effects provided by offset diode 124.

Illustratively, the load, to be controlled by the waveform amplitude at output 10a', can be controlled to an "off" and 15 different discrete "on" levels. Accordingly, only four output lines, and associated resistance elements, would normally be required. A fifth output (O₄) and associated resistance element (122e) are utilized when the load is to be controlled to the zero-th, or "off", level, due to the peculiarities of the particular load, which requires an "off" input voltage which is not a linear step, relative to the linearly-changing "on" levels. The value of resistance element 122e is accordingly chosen, in conjunction with the values of resistance elements 122a–122d, such that transistor 132 will be saturated when outputs O₀–O₄ are enabled.

The variable D.C. voltage at the transistor 132 emitter electrode is coupled to the feedback resistance elements 152 and 154 of a square-wave oscillator (comparator 175 and associated passive elements). The frequency of the waveform at the comparator output 175a is a function of resistance elements 152, 179 and 182 and capacitive element 180, as well as the effective resistance between negative operating potential −V and comparator non-inverting input 175c. For normal, variable-load-output operation, the microcomputer O₅ output is disabled (i.e. an open circuit) and resistance elements 186 and 188 are values selected such that, when paralleling resistance element 184, the total equivalent resistance between input 175c and operating potential −V is equal to the value of resistance element 152. In this manner, equal time constants are provided for each half cycle of the waveform at output 175a, whereby a square-wave, of step-selectable amplitude, is provided thereat. The oscillator square-wave amplitude is amplified by devices 162, 26' and 27' and the passive components associated therewith, and is provided at circuit output 10a', with reference to ground potential.

In the particular illustrative embodiment, as more fully described and claimed in co-pending application Ser. No. 267,328, filed on even date herewith, assigned to the assignee of the present invention, and incorporated in its entirety herein by reference, the controlled load (a fluorescent lamp and ballast) requires a zero to six peak volt range for controlling the "on" load output (light) range. However, the ballast will only turn the load off upon receiving a ten volt peak signal. If a convenient magnitude of operating potential −V (e.g. −15 volts) is utilized, the peak "off" voltage required at output 10a' can not be realized with a square-wave output waveform. Therefore, the "off" signal is provided by a pulse voltage, provided essentially at the repetition rate of the "on" square-wave. This pulse is produced by enabling the O₅ output of microcomputer 120. When the O₅ output is thus connected to ground potential, resistance element 186 is effectively in parallel connection with resistance element 182, whereby the normal square waveform at output 175a is changed to an asymmetrical pulsed waveform, having a peak amplitude essentially equal to the operating potential magnitude. The duty cycle of this pulse waveform is chosen such that the waveform at output 10a' is asymmetrical about 0 volts, due to coupling capacitance 29', and with approximately a 10 volt positive level and a two volt negative level. This waveform is sufficient to turn "off" the particular load connected to output terminal 10a'. Utilizing a pulsed waveform for load turn-off, transistor 162 provides the necessary signal inversion to provide the amplifier output waveform leading edge with a rise time limited by capacitance element 168 and by the constant current source (comprised of transistors 156 and 158) necessary to assure maximum output swing of output transistors 26' and 27' under full load conditions. Thus, it will be understood that the signal characteristic to be varied may be the signal frequency, phase, duty cycle, pulse width, and so forth, in addition to signal amplitude.

While several preferred embodiment of the apparatus have been described herein, many modifications and variations will now become apparent to those skilled in the art. It is our intent, therefore, to be limited only by the scope of the appending claims and not by the specific embodiments selected for description herein.

What is claimed is:

1. A circuit for providing an output signal of controllable amplitude responsive to the data contained in at least one externally-provided digital control signal, comprising:

feedback oscillator means for providing a periodic output waveform having a selected frequency and a variable amplitude responsive to the magnitude of a first voltage applied to a control input of said oscillator means;

a circuit output terminal at which appears the circuit output signal with said oscillator means output waveform frequency and said controllable amplitude;

first and second sources of circuit operating potential;

a plurality of resistance elements each having a first terminal thereof connected in parallel to the first terminals of all other resistance elements, and each having a second terminal; said resistance element second terminal being individually connectable to one of said first and second sources of circuit operating potential responsive to said digital control signal data; and means connected between said resistance element first terminals and said oscillator means control input for supplying to said oscillator means control input said first voltage at an amplitude established by the particular combination of said resistance element second terminals connected respectively to said first and second operating potentials.

2. The circuit of claim 1, wherein said feedback oscillator means comprises: a differential amplifier receiving said first and second operating potentials and having an inverting input, a non-inverting input and an output; a capacitive element coupled between said inverting input and said first operating potential; first and second feedback resistance elements coupled between said differential amplifier output and one of inverting and non-inverting inputs, respectively; an electrical resistance connected between said non-inverting input and said first operating potential; and first and second series-connected resistance elements connected between said non-inverting input and said output; the junction between series-connected resistance elements forming said feedback oscillator means control input.

3. The circuit of as set forth in claim 2, wherein said oscillator means output waveform is a substantially square waveform.

4. The circuit as set forth in claim 3, wherein said electrical resistance and said second feedback resistance element are of substantially equal magnitudes to cause said oscillator means to provide said substantially square output waveform.

5. The circuit as set forth in claim 1 or 2, wherein said first voltage supplying means comprises: another differential amplifier having a non-inverting input connected to said resistance element first terminals, an inverting input and an output; a gain-setting resistance connected between said another differential amplifier input and said first operating potential; a transistor having a collector electrode connected to said second operating potential, a base electrode connected to said another differential amplifier output, and an emitter electrode which is said converting means output and is connected to said oscillator means control input; and a feedback resistance element connected between said differential amplifier inverting input and said transistor emitter electrode.

6. The circuit is set forth in claim 5, wherein said first voltage supplying means further comprises: a diode having an anode connected to said resistance element first terminals and a cathode; and an additional resistance element connected between the diode cathode and said first operating potential.

7. The circuit of claim 6, wherein said first voltage supplying means further comprises another diode in series with said feedback resistance element.

8. The circuit of claim 7, wherein said another diode is selected to temperature compensate for the effects of said first diode.

9. The circuit of claim 5, further comprising a capacitance element connected between said another differential amplifier inverting input and said converting means output.

10. The circuit of claim 5, further comprising a low pass filter network connected between said another differential amplifier output and said second operating potential.

11. The circuit of claim 1, further amplifier comprising amplifier means for providing said oscillator means output waveform to said circuit output terminal with a varying amplitude responsive to the variable amplitude waveform of said oscillator means.

12. The circuit of claim 11, wherein said amplifier means comprises: a complementary-symmetry pair of output transistors, each having base and emitter electrodes respectively connected to the respective base and emitter electrodes of the other transistor, and each having a collector electrode connected to a different one of said first and second operating potentials; a driver transistor having a collector electrode connected to said output transistor base electrodes, an emitter electrode connected to said first operating potential and a base electrode receiving said oscillator means output; waveform; and a capacitive element for coupling the output transistor emitter electrodes to said circuit output terminal.

13. The circuit of claim 12, wherein said amplifier means further comprises: a resistance element coupling said oscillator means output waveform to said driver transistor base electrode; and a capacitive element in electrical parallel connection across said coupling resistance element.

14. The circuit of claim 12, wherein said amplifier means further comprises means for providing a current, to said output transistor base electrodes, of magnitude responsive to the magnitude of said first voltage.

15. The circuit of claim 14, wherein said current providing means comprises: first and second transistors, each having a base electrode connected to each other and to a collector electrode of the first transistor, the collector electrode of said second transistor being connected to said output transistor base electrodes, and each having an emitter electrode; first and second resistance elements each having a first terminal connected to one of said first and second transistor emitter electrodes and having a second terminal receiving said first voltage; and another resistance element coupled between said first and second transistor base electrodes and said first operating potential.

16. The circuit of claim 15, wherein said digital control signal is provided from a plurality of independently-controllable outputs of microcomputer.

17. The circuit of claim 16, wherein said oscillator means is adapted for providing a pulsed periodic output waveform at said selected frequency, responsive to a second voltage applied to said oscillator means.

18. The circuit of claim 17, wherein another independently controlled output of said microcomputer provides said second voltage as a selected one of said first and second operating potentials; said oscillator means pulsed output waveform being provided by changing a circuit parameter of said oscillator means responsive to a first one of said first and second operating potentials being provided at said another microcomputer output; said oscillator means providing a substantially square output waveform when said another microcomputer output provides the remaining one of said first and second operating potentials.

19. The circuit of claim 1, wherein said oscillator means is adapted for providing a periodic pulse waveform at said selected frequency, responsive to a second voltage applied to said oscillator means.

* * * * *